(12) United States Patent
Hayashi et al.

(10) Patent No.: US 6,774,442 B2
(45) Date of Patent: Aug. 10, 2004

(54) SEMICONDUCTOR DEVICE AND CMOS TRANSISTOR

(75) Inventors: Kiyoshi Hayashi, Tokyo (JP); Yasuo Inoue, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/908,618

(22) Filed: Jul. 20, 2001

(65) Prior Publication Data

US 2002/0011636 A1 Jan. 31, 2002

Related U.S. Application Data

(63) Continuation-in-part of application No. 09/749,901, filed on Dec. 29, 2000, now abandoned.

(30) Foreign Application Priority Data

Jul. 21, 2000 (JP) .................................... P2000-220770
Apr. 20, 2001 (JP) .................................... P2001-122998

(51) Int. Cl.[7] .......................... H01L 29/78; H01L 31/113
(52) U.S. Cl. ..................................... 257/412; 257/413
(58) Field of Search .................................. 257/412, 413

(56) References Cited

U.S. PATENT DOCUMENTS

| 5,221,853 | A | * | 6/1993 | Joshi et al. ................. 257/383 |
| 5,576,579 | A | | 11/1996 | Agnello et al. ............. 257/751 |
| 5,619,057 | A | * | 4/1997 | Komatsu ..................... 257/382 |
| 5,744,845 | A | | 4/1998 | Sayama et al. ............. 257/371 |
| 6,177,351 | B1 | * | 1/2001 | Beratan et al. ............. 438/694 |
| 6,187,676 | B1 | | 2/2001 | Kim et al. |
| 6,306,743 | B1 | * | 10/2001 | Lee ............................ 257/413 |
| 6,373,114 | B1 | * | 4/2002 | Jeng et al. .................. 257/368 |
| 6,376,868 | B1 | * | 4/2002 | Rhodes ....................... 257/215 |

FOREIGN PATENT DOCUMENTS

| JP | 8-236479 | 9/1996 | |
| JP | 10135460 A | * 5/1998 | ........... H01L/29/78 |
| JP | 11-233451 | 8/1999 | |
| TW | 469569 | 12/2000 | |

OTHER PUBLICATIONS

S. Wolf et al., "Silicon Processing for the VLSI Era," vol. 1—Process Technology, 1986, pp. 155–156.*
K. Nakajima, et al., "Formation mechanism of ultrathin WSiN barrier layer in a W/WNx/Si system", Applied Surface Science, 117/118 (1997), pp. 312–316.
M. T. Takagi, et al., "A Novel 0.15 $\mu$m CMOS Technology using W/WNx/Polysilicon Gate Electrode and Ti Silicided Source/Drain Diffusions", IEDM 96, pp. 455–458.

* cited by examiner

*Primary Examiner*—Allan R. Wilson
(74) *Attorney, Agent, or Firm*—Oblon, Spivak, McClelland, Maier & Neustadt, P.C.

(57) ABSTRACT

Provided are a semiconductor device comprising a polymetal gate electrode that can prevent formation of a silicide layer at the interface between metal and conductive silicon and also exhibit low resistance property and ohmic property, and a method for manufacturing the same. Specifically, a polymetal gate electrode is formed via a gate insulating film (2), e.g., an oxide film, on a semiconductor substrate (1), e.g., a silicon substrate. The polymetal gate electrode has such a structure that a conductive silicon film (3), e.g., a poly-Si film, a silicide film (4), e.g., a WSi film, a barrier film (5), e.g., a WSiN film, and a metal film (6), e.g., a W film, are stacked over the semiconductor substrate (1) in the order named.

4 Claims, 16 Drawing Sheets

SEMICONDUCTOR DEVICE AND CMOS TRANSISTOR

This application is a continuation-in-part of U.S. application Ser. No. 09/749,901 filed Dec. 29, 2000, now abandoned.

BACKGROUND OF THE INVENTION

1. Field of the Invention

The present invention relates generally to a semiconductor device and a method for manufacturing the same, and more specifically, to a gate electrode structure and a wiring structure having the same shape as a gate electrode of MISFETs (metal insulator semiconductor field effect transistors).

2. Description of the Background Art

Either of conductive silicon single layer structure (e.g., poly-Si) and silicide/conductive silicon stacked structure (e.g., $WSi_2$/poly-Si and $CoSi_2$/poly-Si) has mainly been adopted for a conventional gate electrode and wiring.

However, in situations where MISFETs mid wirings are miniaturized as high integration of semiconductor integrated circuits proceeds, if the above-mentioned structures remain unchanged, the resistance value of a gate electrode and wiring is increased. The result is that the amount of signal delay in the gate electrode and wiring is increased, thereby diminishing the merit of high speed operation owing to miniaturization.

For instance, in case of $CoSi_2$/poly-Si stacked structure, the sheet resistance of $CoSi_2$ is relatively low, namely about 7 Ω, which in some cases may not be so large demerit over signal delay. However, since the $CoSi_2$/poly-Si stacked structure is formed by salicide (self aligned silicide) method, it is difficult to form a SAC (self aligned contact) structure while employing the $CoSi_2$/poly-Si stacked structure.

As used herein, the term "SAC structure" indicates the structure in which an insulting film such as a silicon nitride film is formed on the upper and side surfaces of a gate electrode and wiring. This insulating film functions to prevent the gate electrode and contact holes from being short-circuited even if alignment deviates when contact holes toward source/drain regions are formed in an interlayer insulating film. As high integration is advanced, the margin of the distance between the gate electrode and the contact holes toward the source/drain regions is reduced and thus liable to cause short-circuit. Hence, the SAC structure is becoming increasingly essential to high integrated semiconductor devices.

Since in salicide method a gate electrode and source/drain regions are simultaneously subjected to silicidation, an insulating film of SAC structure cannot be formed prior to salicide method. Therefore, the insulating film of SAC structure should be formed after passing through the process with salicide method.

In this state, it is however difficult to form an insulating film on the upper and side surfaces of the gate electrode. If an insulating film is formed by using photolithography and etching techniques, in some cases, alignment of the insulating film itself may deviate and fail to prevent short-circuit between the gate electrode and contact holes. For this reason, it is difficult to form the SAC structure while employing the $CoSi_2$/poly-Si stacked structure.

It an also be considered to form the $CoSi_2$/poly-Si stacked structure by polycide method in place of salicide method. However, the $CoSi_2$/poly-Si stacked structure cannot be formed by polycide method because any suitable method for patterning the $CoSi_2$/poly-Si stacked structure has not presently been discovered.

As a gate electrode structure and a wiring structure, there has been proposed a polymetal gate electrode having a metal/barrier film/conductive silicon stacked structure that can further reduce sheet resistance than the conductive silicon single layer structure or silicide/conductive silicon stacked structure and also can form the SAC structure. Such gate electrode structure and wiring structure are introduced in, e.g., "A Novel 0.15 μm CMOS Technology using W/$WN_x$/Polysilicon Gate Electrode and Ti Silicided Source/Drain Diffusions" IEDM '96, pp. 455–458, and "Formation mechanism of ultrathin WSiN barrier layer in a W/$WN_x$/Si system" Applied Surface Science 117/118 (1997), pp. 312–316.

FIG. 12 illustrates a polymetal gate electrode structure. In FIG. 12, a polymetal gate electrode is formed via a gate insulating film 2 (e.g., oxide film) oil a semiconductor substrate 1 (e.g., silicon substrate). The polymetal gate electrode has such a structure that a conductive silicon film 3 (e.g., poly-Si film), a barrier film 5 (e.g., $WN_x$ film or WSiN film) and a metal film 6 (e.g., W film) are stacked over the semiconductor substrate 1 in the order named.

In the polymetal gate electrode, sheet resistance is extremely small, namely about 5 Ω or below, thereby to minimize the amount of signal delay in the gate electrode and wiring. This makes it possible to sufficiently utilize the merit of high speed operation owing to miniaturization.

In addition, the SAC structure can be formed easily because no formation process such as salicide method is employed. Referring to FIG. 12, before the conductive silicon film 3, barrier film 5 and metal film 6 are formed into the gate electrode and wiring, an insulating film (not shown) is further patterned on the metal film 6 and then shaped into a gate electrode and wiring by using photolithography and etching techniques. This results in the gate electrode and wiring having the insulating film on the upper surface thereof. Subsequently, the usual side wall formation process is carried out to obtain the SAC structure.

The reason why the barrier film 5 is used in the polymetal gate electrode structure is as follows.

In the case of a simple two-layer stacked structure such as of metal/conductive silicon, when it passes through a high temperature process inherent in the process of manufacturing a semiconductor device, respective contact parts of metal and silicon react with each other to form a silicide layer at the interface therebetween. The resistance value of the silicide layer is usually higher than that of metal, thus leading to an increased resistance value of the gate electrode and wiring.

In order to avoid such a silicide layer formation phenomenon, the barrier layer is provided. When W is used for the metal film 6 in FIG. 12, the above-mentioned $WN_x$ film or WSiN film suppresses the mutual diffusion of metal and silicon, and functions as the barrier film 5. Since the barrier film 5 avoids formation of a silicide layer, the resistance value of the gate electrode and wiring can be maintained low even after passing through the high temperature process.

However, the polymetal gate electrode employing a $WN_x$ film or WSiN film as a barrier film, has the following drawback that the resistance value between metal and conductive silicon cannot be minimized and the resistance value between metal and conductive silicon is not stable to the current density variation. This will be described by referring to FIG. 13. As used herein, the term "the resistance value between metal and conductive silicon" is a value obtained by dividing the potential difference between the conductive silicon film 3 and metal film 6 by the current density passing therethrough.

FIG. 13 is a graph showing the result of measurement of the resistance-current density characteristic between metal and conductive silicon in the polymetal gate electrode of FIG. 12. In FIG. 13, the ordinate represents resistance Re and the abscissa represents current density J.

As shown in FIG. 13, the resistance value between metal and conductive silicon is approximately $1 \times 10^{-5}$ $\Omega \cdot cm^2$ or more, which cannot be said to be sufficiently low value. This has made it difficult to suppress signal delay due to the resistance between metal and conductive silicon.

Further, as shown in FIG. 13, with respect to the current density variation, the resistance value between metal and conductive silicon is unstable and exhibits non-ohmic property. Thus, the gate voltage varies as the current density varies. This has made it difficult to say that the polymetal gate electrode employing a $WN_x$ film or WSiN film as a barrier film is suited as a gate electrode.

The foregoing drawbacks seem to be due to high resistance of the $WN_x$ film or WSiN film as being a barrier film.

SUMMARY OF THE INVENTION

According to a first aspect of the invention, a semiconductor device comprises a substrate, a conductive silicon film overlying the substrate, a silicide film overlying the conductive silicon film and containing metal atoms and silicon atoms, a barrier film overlying the silicide film and having any one of a first combination containing metal atoms, nitrogen atoms and silicon atoms, a second combination containing silicon atoms and at least one of oxygen atoms and nitrogen atoms, and a third combination containing metal atoms and nitrogen atoms, and a metal film overlying the barrier film.

According to a second aspect of the invention, the semiconductor device of the first aspect is characterized in that the metal atoms contained in the silicide film is of one or a plurality of types selected from the group consisting, of W, Mo, Ti, Ta, Nb, V, Zr, Hf, Cr and Co.

According to a third aspect of the invention, the semiconductor device of the first aspect is characterized in that the barrier film has the first or third combination, and that the metal atoms contained in the barrier film is of one or a plurality of types selected from the group consisting of W, Mo, Ti, Ta, Nb, V, Zr, Hf, Cr and Co.

According to a fourth aspect of the invention, the semiconductor device of the first aspect is characterized in that the conductive silicon film contains a dopant, and that the silicide film is formed in the shape of discontinuous islands.

According to a fifth aspect of the invention, a method of manufacturing a semiconductor device comprises the steps of: (a) forming a conductive silicon film on a substrate; (b) forming a silicide film containing metal atoms and silicon atoms on the conductive silicon film; (c) forming, on the silicide film, a barrier film having any one of a first combination containing metal atoms, nitrogen atoms and silicon atoms, a second combination containing silicon atoms and at least one of oxygen atoms and nitrogen atoms, and a third combination containing metal atoms and nitrogen atoms; (d) forming a metal film on the barrier film; and (e) patterning the conductive silicon film, the silicide film, the barrier film and the metal film by using photolithography and etching techniques.

According to a sixth aspect of the invention, the method of the fifth aspect is characterized in that the barrier film has the fix combination, and that the step (c) includes the steps of: (c1) forming a metal nitride film containing metal atoms and nitrogen atoms; and (c2) performing a heat treatment for allowing the silicon atoms contained in the silicide film to react with the metal nitride film, to form a barrier film containing metal atoms, nitrogen atoms and silicon atoms.

According to a seventh aspect of the invention, the method of the fifth aspect is characterized in that the barrier film has the first combination, and that the step (c) includes the steps of: (c1) forming a metal nitride film containing metal atoms and nitrogen atoms; and (c2) performing, after the step (e), a heat treatment for allowing the silicon atoms contained in the silicide film to react with the metal nitride film, to form a barrier film containing metal atoms, nitrogen atoms and silicon atoms.

According to an eighth aspect, the method of the fifth aspect further comprises the steps of: (f) introducing a dopant into the conductive silicon film; and (g) performing a heat treatment of the silicide film so as to be formed in the shape of discontinuous islands.

According to a ninth aspect of the invention, the method of the eighth aspect is characterized in that the thickness of the silicide film is set to about not more than 10 nm.

According to a tenth aspect of the invention, the method of tie fifth aspect is characterized in that the metal atoms contained in the silicide film is of one or a plurality of types selected from the group consisting of W, Mo, Ti, Ta, Nb, V, Zr, Hf, Cr and Co.

According to an eleventh aspect of the invention, the method of the fifth aspect is characterized in that the barrier film has the first or third combination, and that the metal atoms contained in the barrier film is of one or a plurality of types selected from the group consisting of W, Mo, Ti, Ta, Nb, V, Zr, Hf, Cr and Co.

According to a twelfth aspect of the invention, a CMOS transistor comprises at least two semiconductor devices of the fourth aspect as first and second semiconductor devices, wherein structures including the conductive silicon film, the silicide film, the barrier film and tie metal film of the first and second semiconductor devices are used as gate electrodes, gate insulating films a disposed between the substrate and the conductive silicon film of the first and second semiconductor devices, respectively, wells and source/drain regions are disposed in the substrate of the first and second semiconductor devices, respectively, and the conductive silicon films are electrically connected between the first and second semiconductor devices.

The first, second or third aspect enables to realize a semiconductor device comprising the polymetal gate electrode exhibiting low resistance property and ohmic property because the silicide film is interposed between the conductive silicon film and barrier film.

In the fourth aspect, since the silicide film is formed in the shape of discontinuous islands, even if the silicide film sucks up the dopant in the conductive silicon film, the dopant is hard to move across the islands by the presence of the conductive silicon film interposed therebetween.

The fifth, tenth or eleventh aspect enables to manufacture the semiconductor device of the first aspect.

The sixth aspect enables to manufacture the semiconductor device of the first aspect. In addition, since a barrier film is formed by using the thermal reaction between the silicide film and metal nitride film, the resulting barrier film is extremely thin, thereby effectively suppressing an increase in the resistance value between metal and conductive silicon.

The seventh aspect has the same effects as the method of the sixth aspect.

The eighth aspect enables to manufacture the semiconductor device of the fourth aspect.

With the ninth aspect, the silicide film is apt to condense in an island shape.

In the twelfth aspect, since the structure including the conductive silicon film, silicide film, barrier film and metal film in the semiconductor device of the fourth aspect is used as a gate electrode, the dopant is hard to move across the gate electrodes of the first and second semiconductor devices, and the threshold voltage value is therefore hard to change.

It is an object of the present invention to provide a semiconductor device comprising a polymetal gate electrode that can prevent formation of a silicide layer at the interface between metal and conductive silicon and also exhibit low resistance property and ohmic property, as well as a method for manufacturing the same.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

A first preferred embodiment of the invention is directed to realize a semiconductor device comprising a polymetal gate electrode tat can prevent formation of a silicide layer at the interface between metal and conductive silicon and also exhibit low resistance property and ohmic property. This semiconductor device can overcome the foregoing drawbacks by interposing a silicide film between a conductive silicon film and a barrier film.

Figure 1:
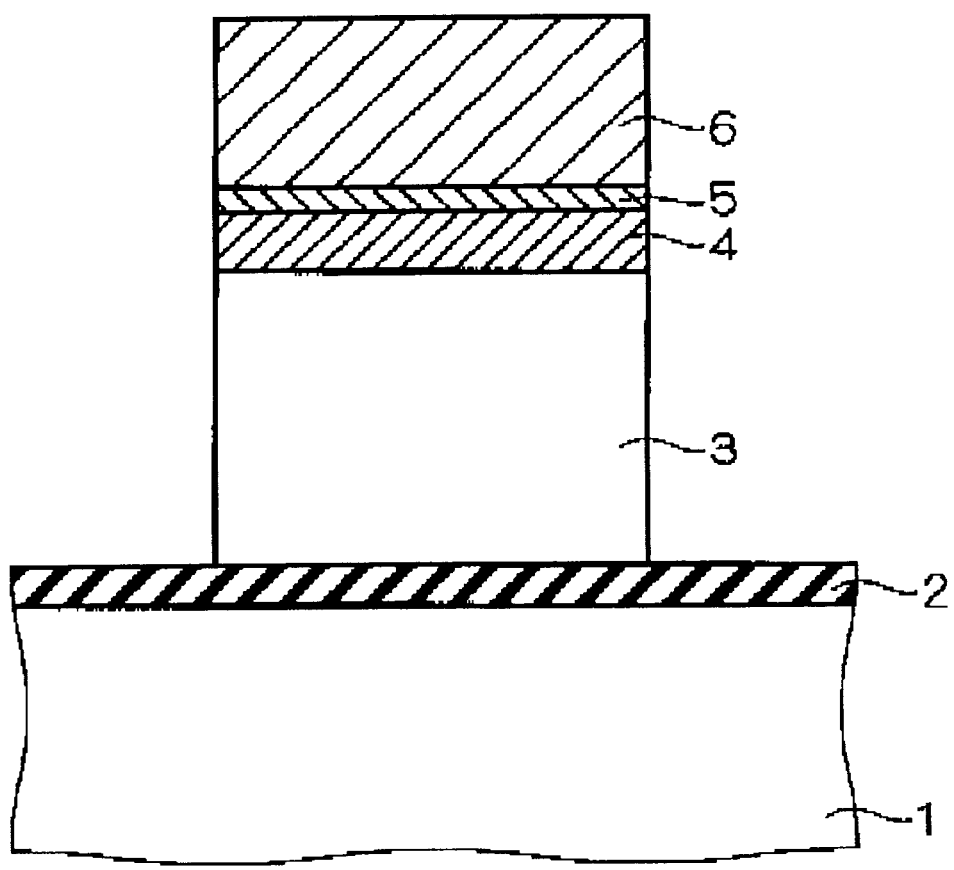
FIG. 1 is a diagram illustrating a semiconductor device according to a first preferred embodiment of the invention.

FIG. 1 is a cross section illustrating a semiconductor device according to the first preferred embodiment. As shown in FIG. 1, in this semiconductor device, a polymetal electrode is formed via a gate insulting film 2 (e.g., oxide film) on a semiconductor substrate 1 (e.g., silicon substrate) in a similar manner to that in FIG. 12.

Figure 12:
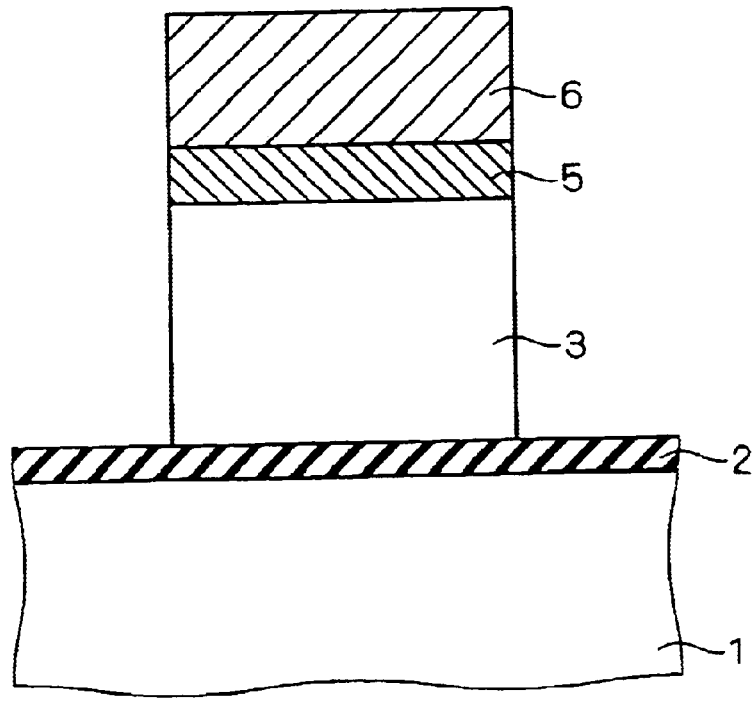
FIG. 12 is a diagram illustrating a conventional semiconductor device.

This polymetal gate electrode is however different from that of FIG. 12, in that a conductive silicon film 3, silicide film 4, barrier film 5 and metal film 6 are stacked over the semiconductor substrate 1 in the order named. That is, unlike FIG. 12, the silicide film 4 is interposed between the conductive silicon film 3 and barrier film 5.

For instance, a poly-Si film and a W film may be adopted for the conductive silicon film 3 and metal film 6, respectively. The silicide film 4 is a film containing metal atoms and silicon atoms, and a WSi film may be adopted therefor. The barrier film 5 is a film containing metal atoms, nitrogen atoms and silicon atoms, and a WSiN film may be adopted therefor.

By providing the silicide film 4, the high resistance property of die barrier film 5 is relaxed and the resistance value between metal and conductive silicon can be lowered than the conventional technique.

Figure 2:
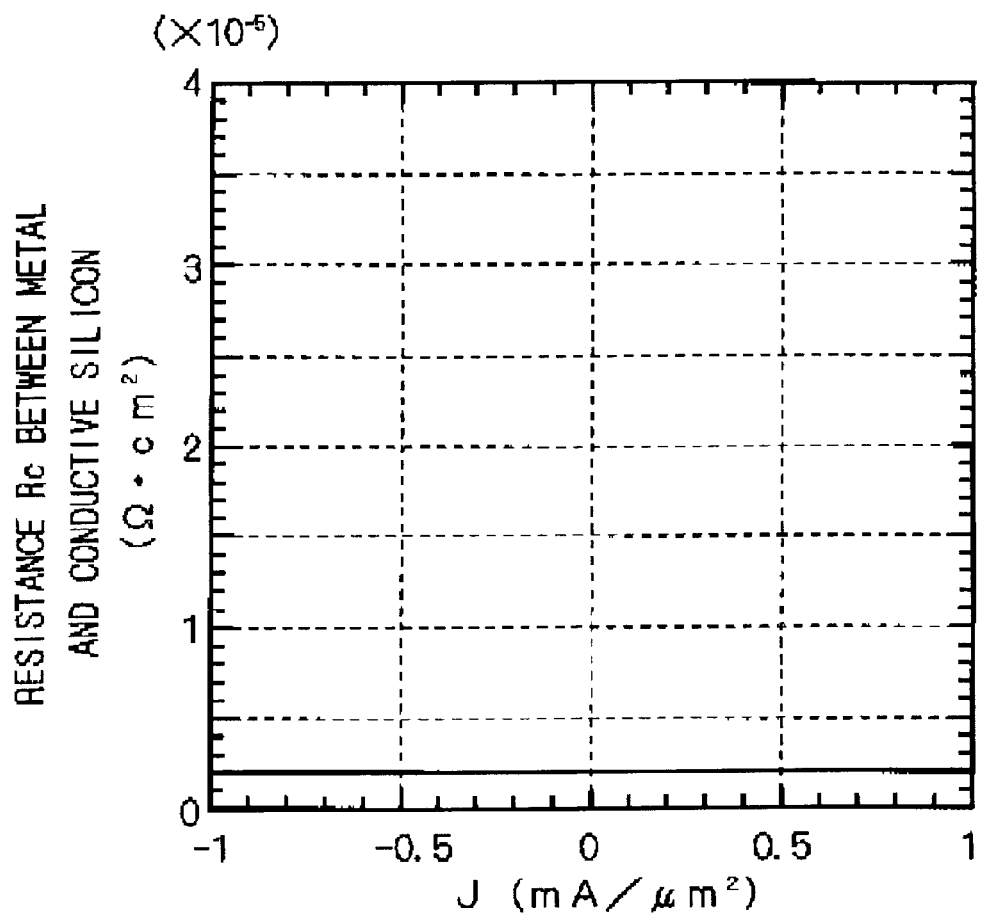
FIG. 2 is a diagram showing the resistance-current density characteristic between metal and conductive silicon in the semiconductor device of the first preferred embodiment.
Figure 13:
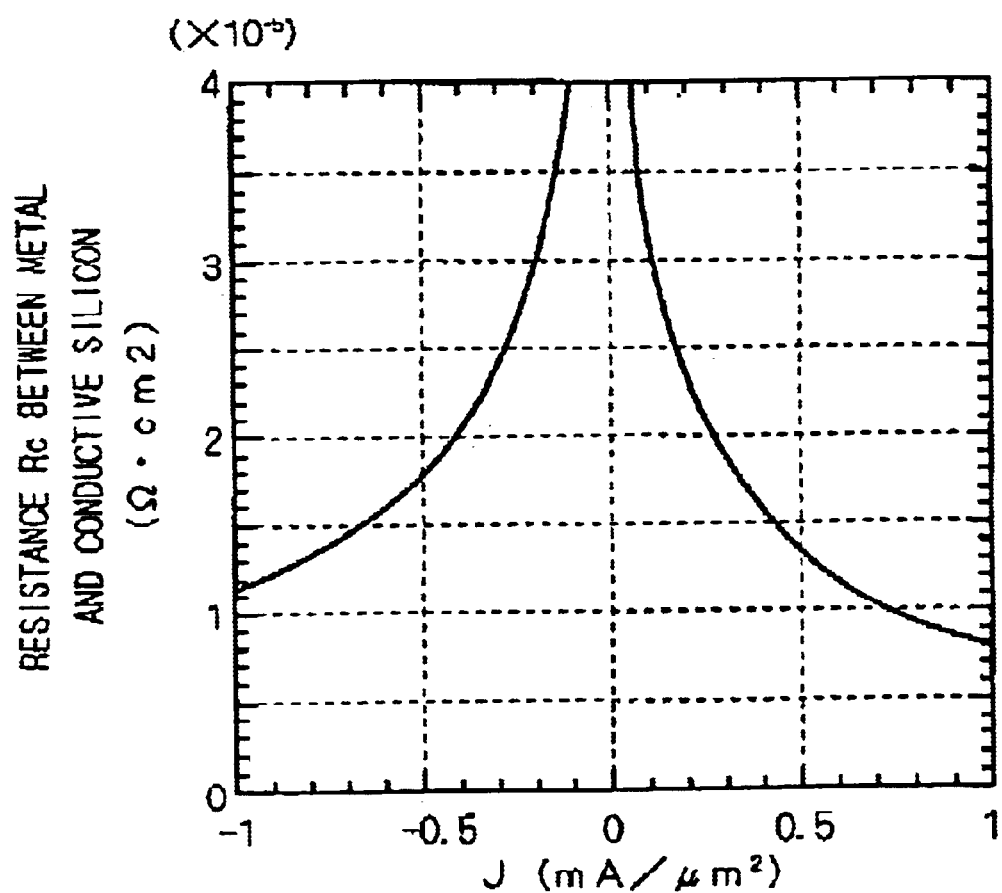
FIG. 13 is a diagram showing the resistance-current density characteristic between metal and conductive silicon in a conventional semiconductor device.

This structure is subjected to the same measurement of the resistance-current density characteristic between metal and conductive silicon as that in FIG. 13, and the result is given in FIG. 2. As shown in FIG. 2, in the semiconductor device of this embodiment the resistance value between metal and conductive silicon is approximately $2 \times 10^{-6}$ $\Omega \cdot cm^2$ or below, which is sufficiently lower than that of the conventional semiconductor device. Accordingly, signal delay due to resistance between metal and conductive silicon can be suppressed by using the semiconductor device of this embodiment.

Further, as shown in FIG. 2, the resistance value between metal and conductive silicon remains constant irrespective of the current density value, and the semiconductor device of this embodiment exhibits ohmic property. Therefore, the gate voltage is hard to vary relative to the current density variation.

Thus, in the semiconductor device of this embodiment, the semiconductor device comprising the polymetal gate electrode exhibiting low resistance property and ohmic property can be realized by interposing the suicide film 4 between the conductive silicon film 3 and barrier film 5.

The metal atoms contained in the silicide film 4 and barrier film 5 may be of one or a plurality of types selected from the group consisting of W, Mo, Ti, Ta, Nb, V, Zr, Hf, Cr and Co. In any case, the same effect as above described is obtainable, Second Preferred Embodiment A second preferred embodiment relates to a method for manufacturing a semiconductor device according to the first preferred embodiment, which is described by referring to FIGS. 3 to 9.

Figure 3:
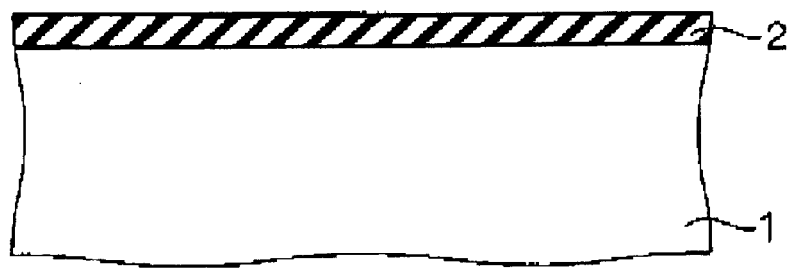
FIGS. 3 to 9 are diagrams illustrating a sequence of steps in a method for manufacturing a semiconductor device according to a second preferred embodiment.
Figure 4:
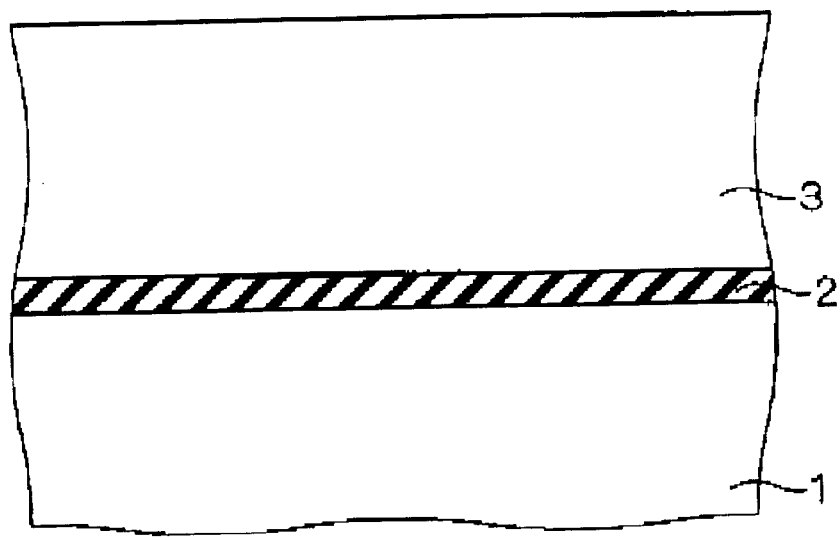

Firstly, as shown in FIG. 3, on a semiconductor substrate 1 such as a silicon substrate, a gate insulating film 2 such as an oxide film is formed in a thickness of approximately 3 nm, for example, by means such as thermal oxidation. Subsequently, as shown in FIG. 4, a conductive silicon film 3 such as a poly-Si film is formed in a thickness of approximately 100 nm, for example, on the gate insulating film 2 by means such as CVD (chemical vapor deposition).

Figure 5:
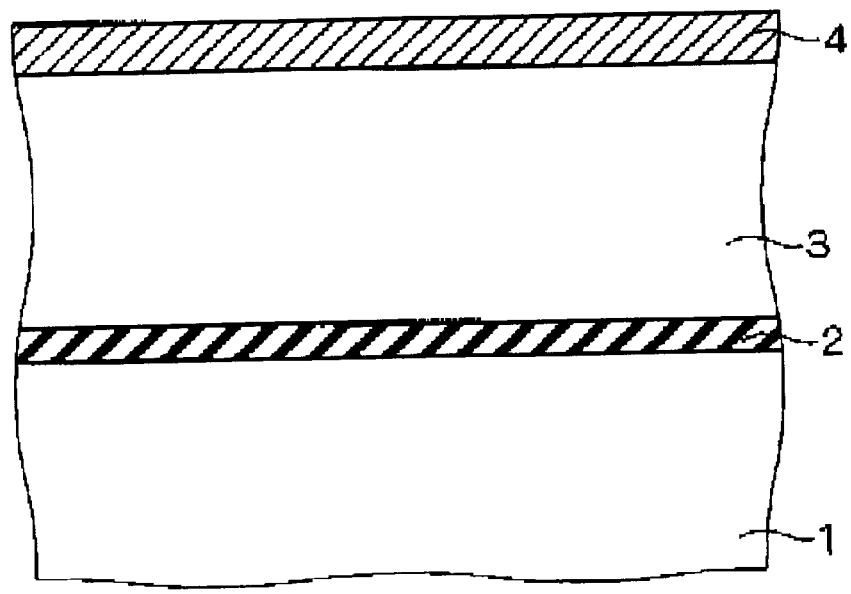
Figure 6:
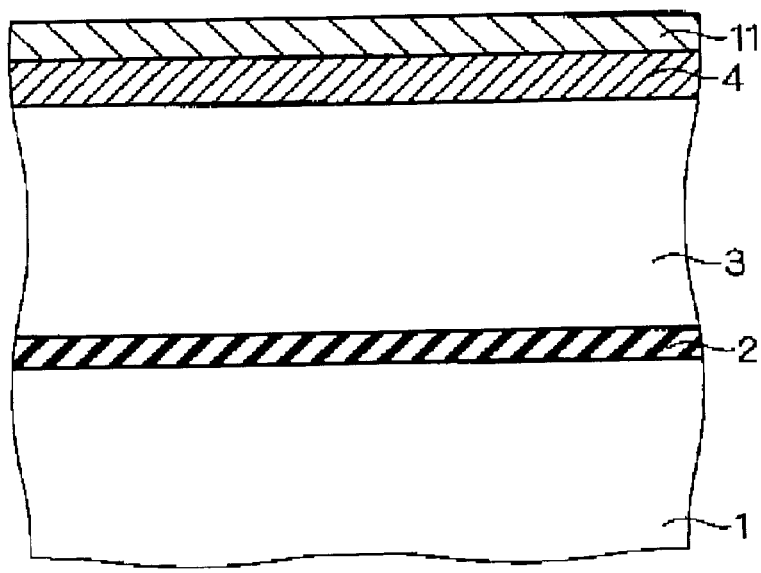
Figure 7:
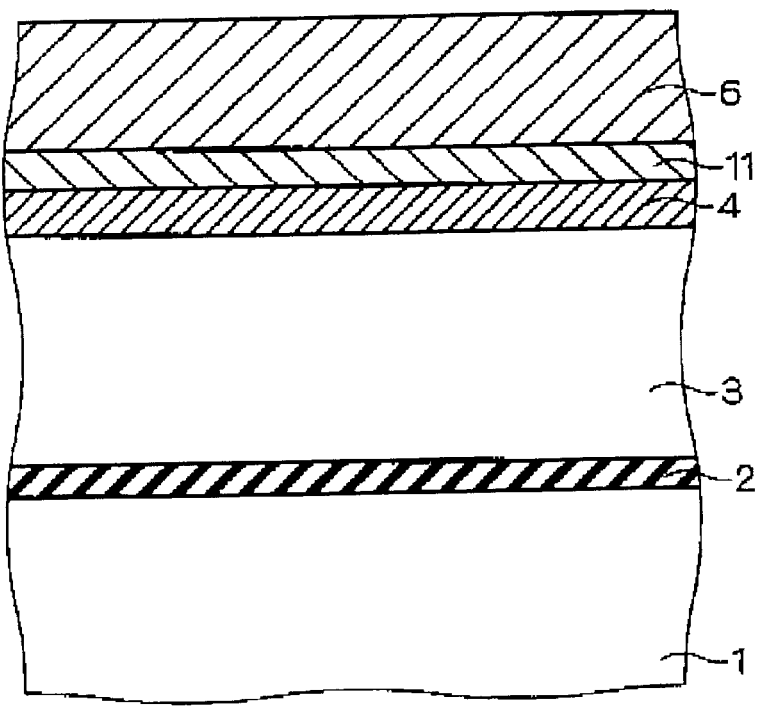

Then, as shown in FIG. 5, a silicide film 4 such as a WSi film is formed in a thickness of approximately 6 nm, for example, on the conductive silicon film 3 by means such as sputtering method. As shown in FIG. 6, a metal nitride film 11 such as a WN film is formed in a thickness of approximately 5 nm, for example, on the suicide film 4 by means such as sputtering method. As shown in FIG. 7, a metal film 6 such as a W film is formed in a thickness of approximately 40 nm, for example, on the metal nitride film 11 by means such as sputtering method.

Figure 8:
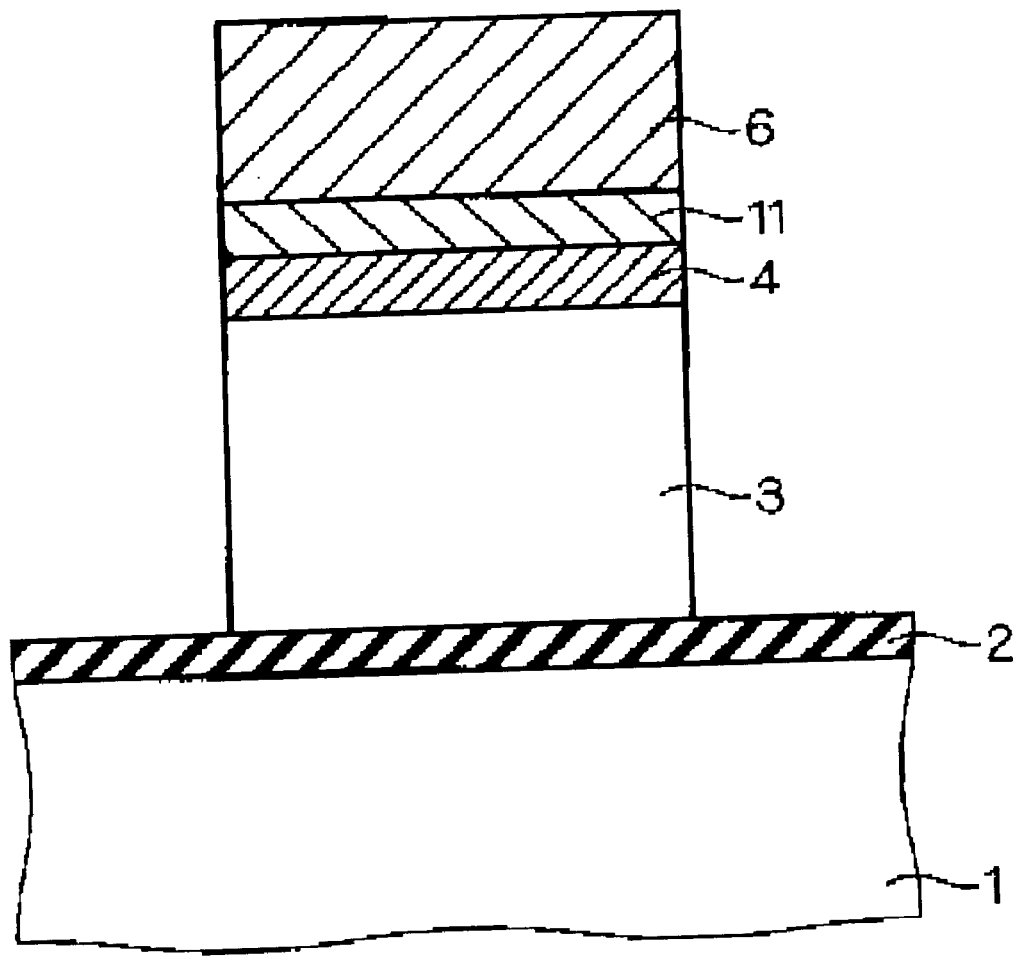

As shown in FIG. 8, the conductive silicon film 3, silicide film 4, metal nitride film 11 and metal film 6 are patterned in the shape of a polymetal gate electrode by using photo-lithography and etching techniques.

Figure 9:
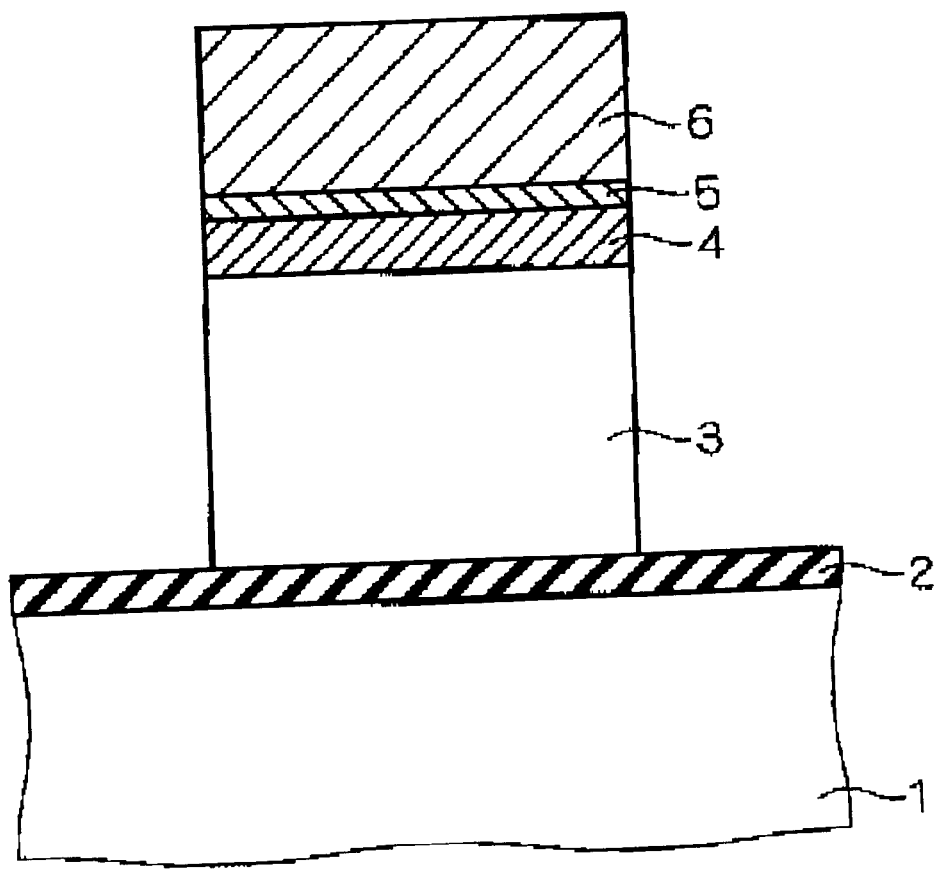

Subsequently, a heat treatment at about 950° C., for example, is performed such that the metal nitride film 11 is allowed to react with the silicon atoms in the directly underlying silicide film 4. The result is, as shown in FIG. 9, that a barrier film 5 containing metal atoms, nitrogen atoms and silicon atoms is formed in a thickness of approximately 1.5 nm, in the vicinity of the interface between the metal nitride film 11 and silicide film 4. The barrier film 5 is, for example, a WSiN film.

Note that a WN film has a low stability to heat and, upon heat treatment, N component is separated and the WN film is easily transformed into a W film. Therefore, when the WN film is used for the metal nitride film 11, the area of the metal nitride film 11 except for the portion transformed into the barrier film 5 due to the heat treatment, becomes a W film which is then assimilated into the overlying metal film 6.

For instance, the above heat treatment may be one which is employed in the step of forming source/drain regions of a MISFET.

With the method of the second preferred embodiment, it is able to manufacture the semiconductor device according to the first preferred embodiment. In addition, since the barrier film 5 is formed by using the thermal reaction between the silicide film 4 and metal nitride film 11, the resulting barrier film 5 is extremely thin, thereby effectively suppressing an increase in the resistance value between metal and conductive silicon.

Third Preferred Embodiment

A third preferred embodiment is a modification of the method of the second preferred embodiment. In a method of the third preferred method, before the polymetal gate electrode is patterned, a barrier film 5 is formed in the vicinity of the interface between the metal nitride film 11 and silicide film 4.

In the same manner as in the second preferred embodiment, the structure shown in FIG. 7 is obtained.

Figure 10:
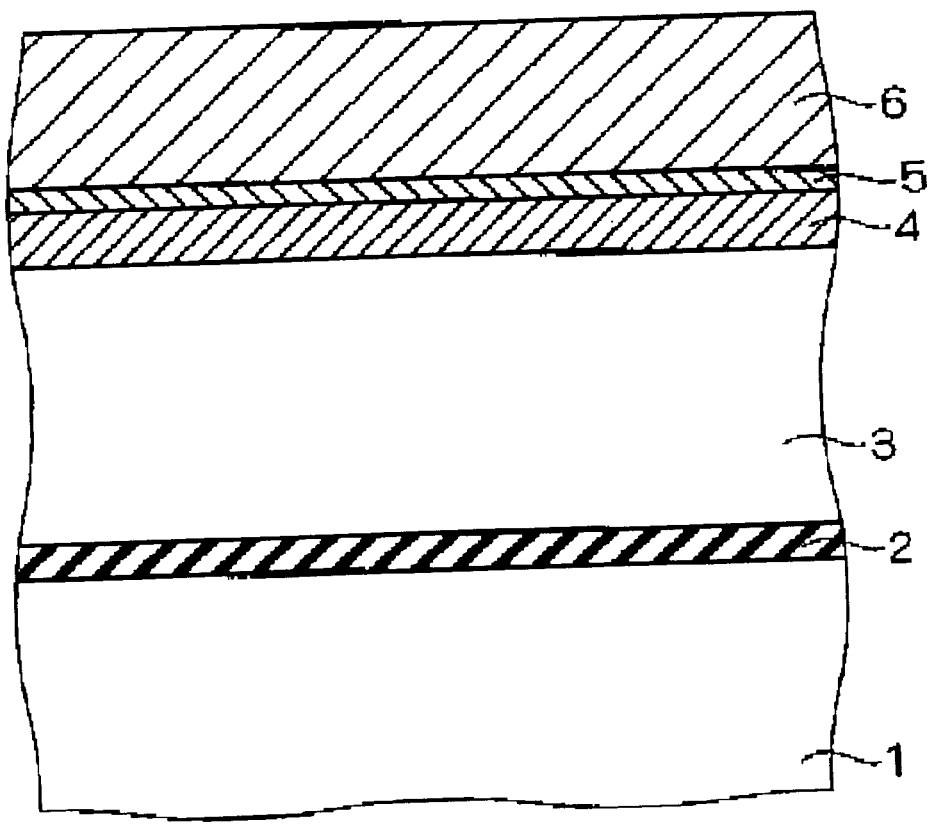
FIGS. 10 and 11 are diagrams illustrating a sequence of steps in a method for manufacturing a semiconductor device according to a third preferred embodiment.

Subsequently, a heat treatment at about 950° C., for example, is performed such that the metal nitride film 11 is allowed to react with the silicon atoms in the directly underlying silicide film 4. The result is, as shown in FIG. 10, that a barrier film 5 containing metal atoms, nitrogen atoms and silicon atoms is formed in a thickness of approximately 1.5 nm, in the vicinity of the interface between the metal nitride film 11 and silicide film 4. The barrier film 5 is, for example, a WSiN film. When a WN film is used for the metal nitride film 11, the area of the metal nitride film 11 except for the portion transformed into the barrier film 5 due to the heat treatment, becomes a W film which is then assimilated into the overlying metal film 6.

Figure 11:
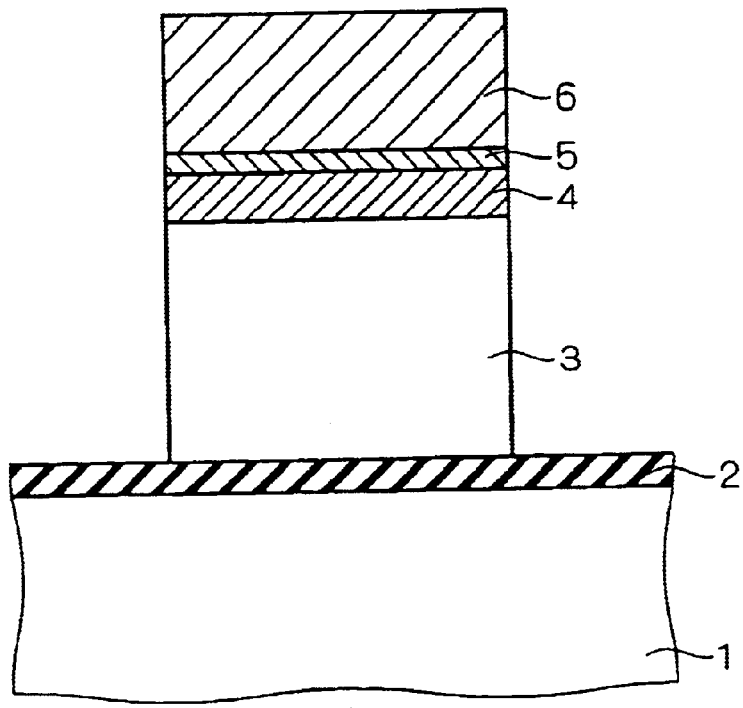

Then, as shown in FIG. 11, the conductive silicon film 3, silicide film 4, barrier film 5 and metal film 6 are patterned in the shape of a polymetal gate electrode by using photo-lithography and etching techniques.

The method of the third preferred embodiment has the same effect as the method of the second preferred embodiment.

Fourth Preferred Embodiment

A fourth preferred embodiment is a modification of the semiconductor device of the first preferred embodiment, in which a film containing silicon atoms and at least either of nitrogen atoms and oxygen atoms is used as a barrier film 5.

Specifically in this embodiment, for example, one or a plurality of a SiN film, a $SiO_2$ film and a SiON film are used as a barrier film 5. Otherwise, the structure is the same as the semiconductor device of the first preferred embodiment. For instance, a poly-Si film, a W film and a WSi film may be adopted for the conductive silicon film 3, metal film 6 and silicide film 4, respectively.

Under this structure, the result of measurement of the resistance-current density characteristic between metal and conductive silicon was similar to that in FIG. 2. Therefore, even by using the semiconductor device of this embodiment, it is able to realize a semiconductor device comprising a polymetal gate electrode exhibiting low resistance property and ohmic property.

The metal atoms contained in the silicide film 4 may be of one or a plurality of types selected from the group consisting of W, Mo, Ti, Ta, Nb, V, Zr, Hf, Cr and Co. In any case, the same effect as set forth is obtainable.

Fifth Preferred Embodiment

A fifth preferred embodiment relates to a method of manufacturing the semiconductor device of the fourth preferred embodiment. Description will be made by referring to FIGS. 3 to 5 and FIGS. 11, 14 and 15.

Like the method of manufacturing a semiconductor device of the second preferred embodiment, firstly, on a semiconductor substrate 1 such as a silicon substrate, a gate insulating film 2 such as an oxide film is formed in a thickness of approximately 3 nm, for example, by means such as thermal oxidation method (FIG. 3). Subsequently, a conductive silicon film 3 such as a poly-Si film is formed in a thickness of approximately 100 nm, for example, on the gate insulating film 2 by means such as CVD method (FIG. 4).

Figure 14:
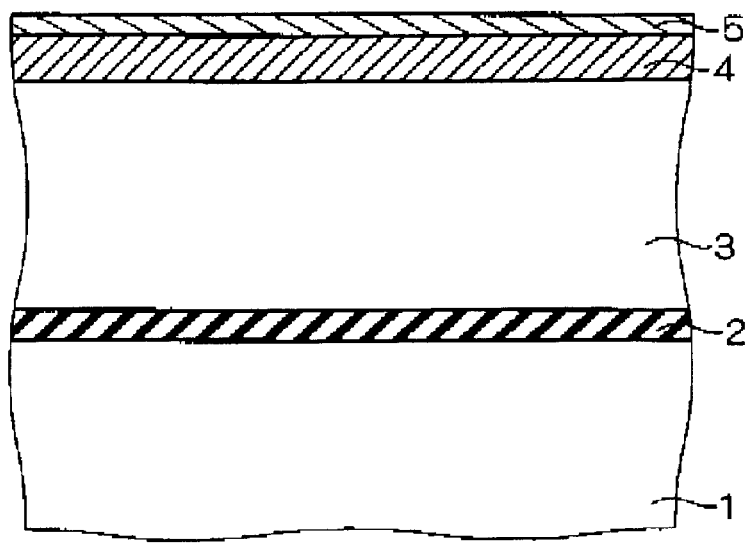
FIGS. 14 and 15 are diagrams illustrating the steps in a method of manufacturing a semiconductor device according to a fifth preferred embodiment.
Figure 15:
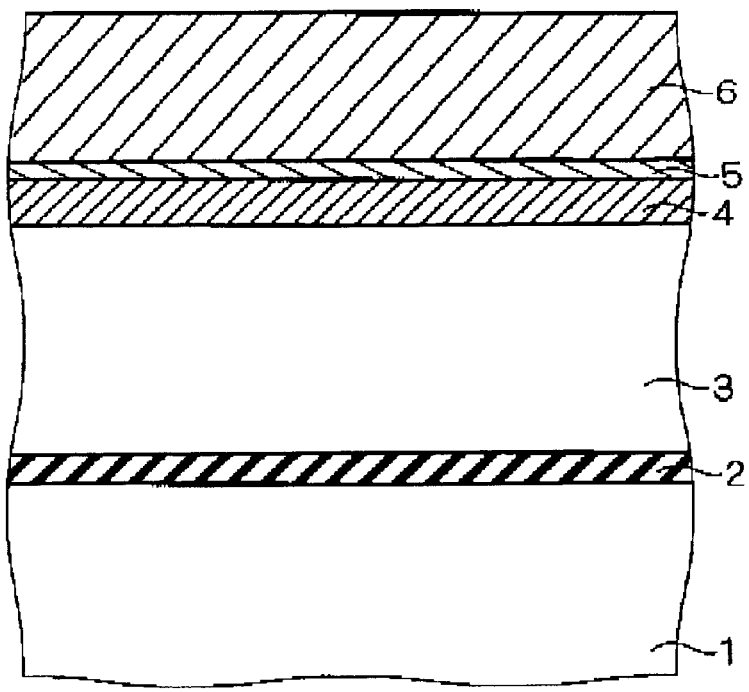

Then, a silicide film 4 such as a WSi film is formed in a thickness of approximately 15 nm, for example, on the conductive silicon film 3 by means such as sputtering method (FIG. 5). As shown in FIG. 14, a barrier film 5 such as a SiN film is formed in a thickness of approximately 3 nm, for example, on the silicide film 4 by means such as CVD method. Further, as shown in FIG. 15, a metal film 6 such as a W film is formed in a thickness of approximately 40 nm, for example, on the barrier film 5 by means such as sputtering method.

Like the case of FIG. 11, the conductive silicon film 3, silicide film 4, barrier film 5 and metal film 6 are patterned in the shape of a polymetal gate electrode by using photo-lithography and etching techniques.

With the method of the fifth preferred embodiment, it is able to manufacture the semiconductor device of the fourth preferred embodiment.

Sixth Preferred Embodiment

A sixth preferred embodiment is also a modification of the semiconductor device of the first preferred embodiment, in which a film containing nitrogen atoms and metal atoms is used as a barrier film 5.

Specifically in this embodiment, for example, a TiN film is used as a barrier film 5. Otherwise, the structure is the same as the semiconductor device of the first preferred embodiment. For instance, a poly-Si film, a W film and a WSi film may be adopted for the conductive silicon film 3, metal film 6 and silicide film 4, respectively.

Under this structure, the result of measurement of the resistance-current density characteristic between metal and conductive silicon was similar to that in FIG. 2. Therefore, even by using the semiconductor device of this embodiment, it is able to realize a semiconductor device comprising a polymetal gate electrode exhibiting low resistance property and ohmic property.

The metal atoms contained in the silicide film 4 and barrier film 5 may be of one or a plurality of types selected from the group consisting of W, Mo, Ti, Ta, Nb, V, Zr, Hf, Cr and Co. In any case, the same effect as set forth is obtainable.

Seventh Preferred Embodiment

A seventh preferred embodiment relates to a method of manufacturing the semiconductor device of the sixth preferred embodiment. Description will be made by referring to FIGS. 3 to 5 and FIGS. 11, 14 and 15.

Like the method of manufacturing a semiconductor device of the second preferred embodiment, firstly, on a semiconductor substrate 1 such as a silicon substrate, a gate insulating film 2 such as an oxide film is formed in a thickness of approximately 3 nm, for example, by means such as thermal oxidation method (FIG. 3). Subsequently, a conductive silicon film 3 such as a poly-Si film is formed in a thickness of approximately 100 nm, for example, on the gate insulating film 2 by means such as CVD method (FIG. 4).

Then, a silicide film 4 such as a WSi film is formed in a thickness of approximately 15 nm, for example, on the conductive silicon film 3 by means such as sputtering method (FIG. 5). Like the case of FIG. 14, a barrier film 5 such as a TiN film is formed in a thickness of approximately 10 nm, for example, on the silicide film 4 by means such as sputtering method. Further, like the case of FIG. 15, a metal film 6 such as a W film is formed in a thickness of approximately 40 nm, for example, on the barrier film 5 by means such as sputtering method.

Like the case of FIG. 11, the conductive silicon film 3, silicide film 4, barrier film 5 and metal film 6 are patterned in the shape of a polymetal gate electrode by using photo-lithography and etching techniques.

With the method of the seventh preferred embodiment, it is able to manufacture the semiconductor device of the sixth preferred embodiment.

Eighth Preferred Embodiment

An eighth preferred embodiment is also a modification of the semiconductor device of the first preferred embodiment, in which a silicide film 4 is formed in the shape of discontinuous islands.

Figure 16:
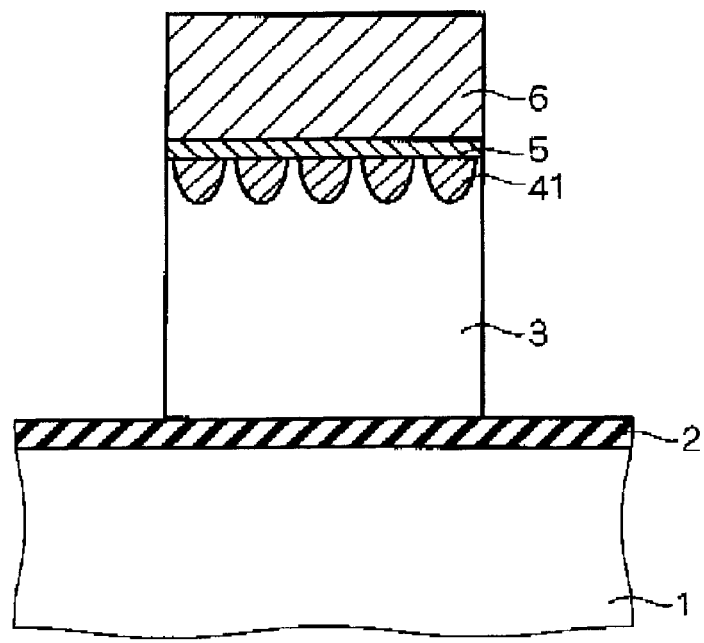
FIG. 16 is a diagram illustrating a semiconductor device according to an eighth preferred embodiment.

FIG. 16 is a sectional view of a semiconductor device according to the eighth preferred embodiment. As shown in FIG. 16, in this semiconductor device an island silicide film 41 formed in the shape of discontinuous islands is disposed in place of the silicide film 4 of the first preferred embodiment.

As a material of the silicide film 41, for example, a WSi film may be adopted therefor as in the first preferred embodiment. Otherwise, the structure is the same as the semiconductor device of the first preferred embodiment. For instance, a poly-Si film, a W film and a WSi film may be adopted for the conductive silicon film 3, metal film 6 and barrier film 5, respectively.

The advantages of forming the silicide film 4 in the shape of discontinuous islands are as follows.

There is the problem that a silicide film has the function of sucking up the impurity in conductive silicon and, therefore, the impurity concentration of the conductive silicon in the periphery of the silicide film is liable to change. The influence of this problem will be described, using for an example the gate electrode of a conventional polycide structure that a silicide film is disposed on a conductive silicon film.

The gate electrode of polycide structure is liable to induce the phenomenon that the dopant (e.g. B, P, As) in a conductive silicon film diffuses into the directly overlying silicide film to reduce the dopant concentration difference between the two films. Alternatively, it is liable to induce the phenomenon that the dopant in the conductive silicon reacts with the silicide film to generate a compound.

Such dopant diffusion phenomenon and reaction phenomenon may occur solely or at the same time. When either of these phenomena takes place, the dopant in the conductive silicon film is sucked up to the silicide film, thereby lowering the dopant concentration of the conductive silicon film.

Further, when a gate electrode forms a CMOS (complementary metal oxide semiconductor) transistor, it is liable that the dopant in the gate electrode of one transistor is sucked up and the sucked dopant moves to the gate electrode of the other transistor trough wiring.

This results in the problem that the dopant concentration in each gate electrode of a P channel MOS transistor and an N channel MOS transistor constituting the CMOS transistor departs from a setting value, and the threshold voltage value of each transistor is made changeable.

Even in the polymetal gate electrode structure of the first preferred embodiment shown in FIG. 1, since the silicide film 4 is disposed between the barrier film 5 and conductive silicon film 3, there is the possibility tat the silicide film 4 sucks up the dopant in the conductive silicon film 3 to change the threshold voltage value of the CMOS transistor, like the case with the foregoing gate electrode of the conventional polycide structure.

Therefore, even if the silicide film 4 sucks up the dopant in the conductive silicon film 3, it is necessary to prevent the phenomenon that the dopant moves from the gate electrode of one transistor to the gate electrode of the other transistor through wiring.

For this reason, the silicide film 4 is formed in the shape of discontinuous islands. By doing so, even if the silicide film 4 sucks up the dopant in the conductive silicon film 3, the dopant is hard to move across the islands by the presence of the conductive silicon film 3 disposed therebetween. Thereby, even when the polymetal gate electrode of the first preferred embodiment is applied to a gate electrode having the CMOS transistor configurations the dopant is hard to move across the gate electrodes of the two transistors, and the threshold voltage value is less changeable.

Figure 17:
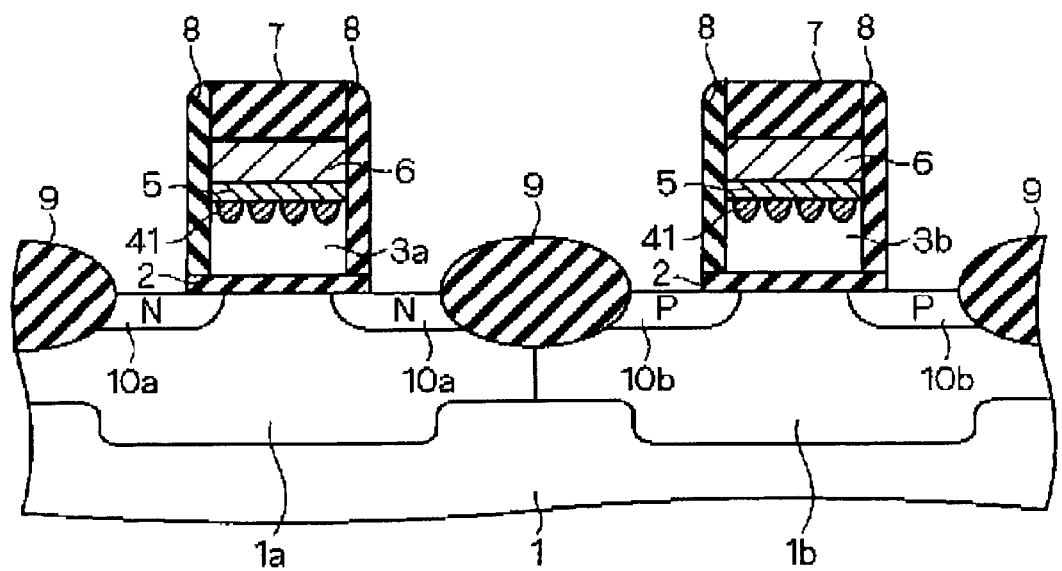
FIG. 17 is a diagram illustrating the case of applying a semiconductor device of the eighth preferred embodiment to a CMOS configuration.

FIG. 17 is a diagram illustrating a configuration when the semiconductor device of the eighth preferred embodiment is applied to a CMOS transistor. In FIG. 17, a P type well 1a and an N type well 1b are disposed adjacent to each other in a semiconductor substrate 1, and the polymetal gate electrode structure of FIG. 16 is disposed on each well.

Specifically, disposed on the P type well 1a is a polymetal gate electrode structure comprising a gate insulating film 2, a conductive silicon film 3a, an island silicide film 41, a barrier film 5 and a metal film 6. Disposed on the N type well 1b is a polymetal gate electrode structure comprising the gate insulating film 2, a conductive silicon film 3b, the island suicide film 41, the barrier film 5 and the metal film 6. Different conductivity type dopants have been introduced into the conductive silicon films 3a and 3b, respectively, In the wells 1a and 1b, source/drain regions 10a and 10b are disposed to form an N channel MOS transistor and a P channel MOS transistor together with the respective polymetal gate electrodes. These polymetal gate electrodes are electrically connected by wiring (which is not shown in the cross-section of FIG. 17).

Referring to FIG. 17, an insulating film 7 covering the upper surface of the polymetal gate electrodes and a sidewall insulating film 8 covering the side surfaces of the polymetal gate electrodes are formed to make a SAC structure. The P channel MOS transistor and N channel MOS transistor are isolated by a field isolating film 9.

A method of forming the silicide film 4 in the shape of discontinuous islands will fully be described in the following ninth preferred embodiment.

Under the structure including such an island silicide film, the result of measurement of the resistance-current density characteristic between metal and conductive silicon was similar to that in FIG. 2. Therefore, even by using the semiconductor device of this embodiment, it is able to realize a semiconductor device comprising a polymetal gate electrode exhibiting low resistance property and ohmic property.

The metal atoms contained in the island silicide film 41 and barrier film 5 may be of one or a plurality of yes selected from the group consisting of W, Mo, Ti, Ta, Nb, V, Zr, Hf, Cr and Co. In any case, the same effect as set forth is obtainable.

Ninth Preferred Embodiment

A ninth preferred embodiment relates to a method of manufacturing the semiconductor device of the eighth preferred embodiment. Description will be made by referring to FIGS. 3 to 5 and FIGS. 18 to 22.

Like the method of manufacturing a semiconductor device of the second preferred embodiment, firstly, on a semiconductor substrate 1 such as a silicon substrate, a gate insulating film 2 such as an oxide film is formed in a thickness of approximately 3 nm, for example, by means such as thermal oxidation method (FIG. 3). Subsequently, a conductive silicon film 3 such as a poly-Si film is formed in a thickness of approximately 100 nm, for example, on the gate insulating film 2 by means such as CVD method (FIG. 4). When a polymetal gate electrode is used in a transistor, in order to control its threshold voltage value, a dopant is introduced into the conductive silicon film 3 at this time.

Then, a silicide film 4 such as a WSi film is formed in a thickness of approximately 5 nm, for example, on the conductive silicon film 3 by means such as sputtering method (FIG. 5).

Figure 18:
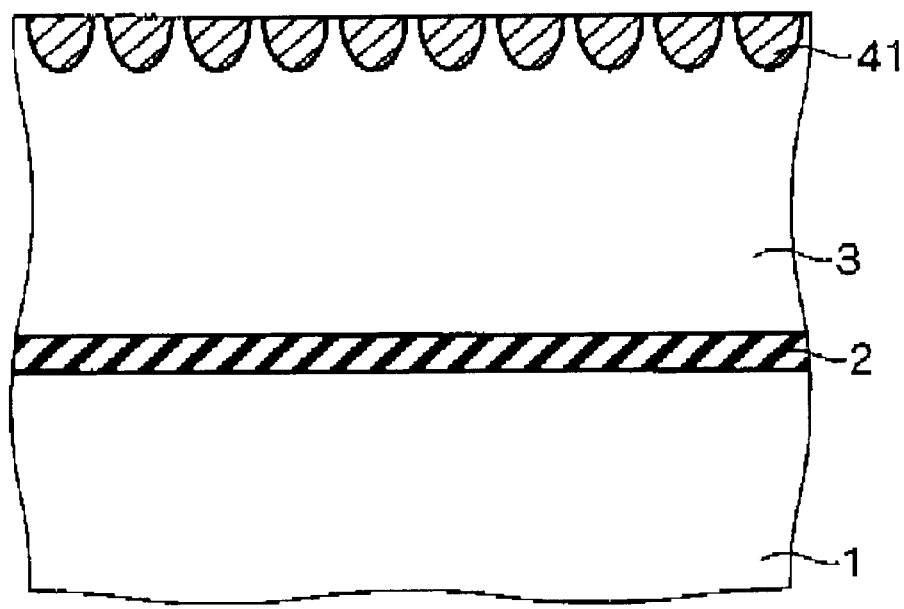
FIGS. 18 to 22 are diagrams illustrating the steps in a method of manufacturing a semiconductor device according to a ninth preferred embodiment.

The silicide film 4 is then allowed to condense in an island shape, thereby to form an island silicide film 41 as shown in FIG. 18. The condensation of the silicide film can be realized by performing a heat treatment at about 900° C., for example. This condensation can be considered the phenomenon resulting from the fact that because of a small thickness of the silicide film 4, the locally shift of atoms is facilitated by the heat treatment. Based on the experiment conducted by the present inventor, it has turned out that the condensation is apt to occur by performing a heat treatment after setting the thickness of the silicide film 4 to approximately not more than 10 nm.

Figure 19:
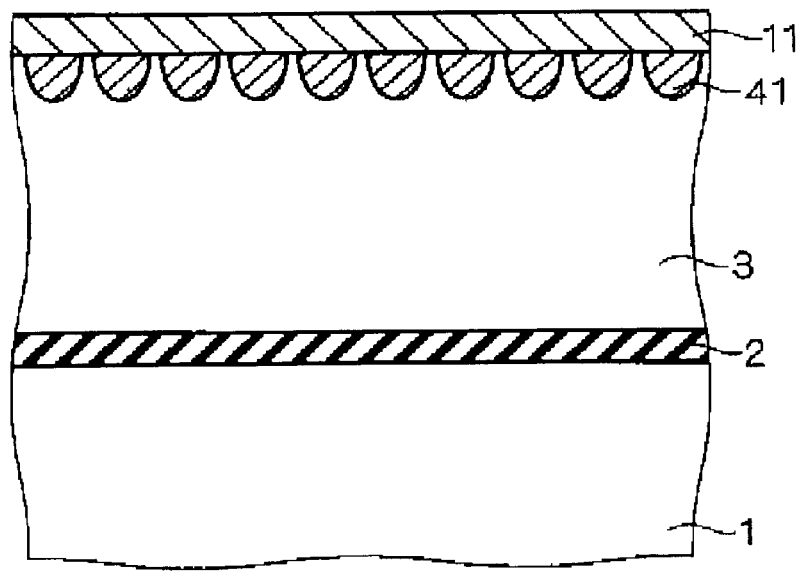
Figure 20:
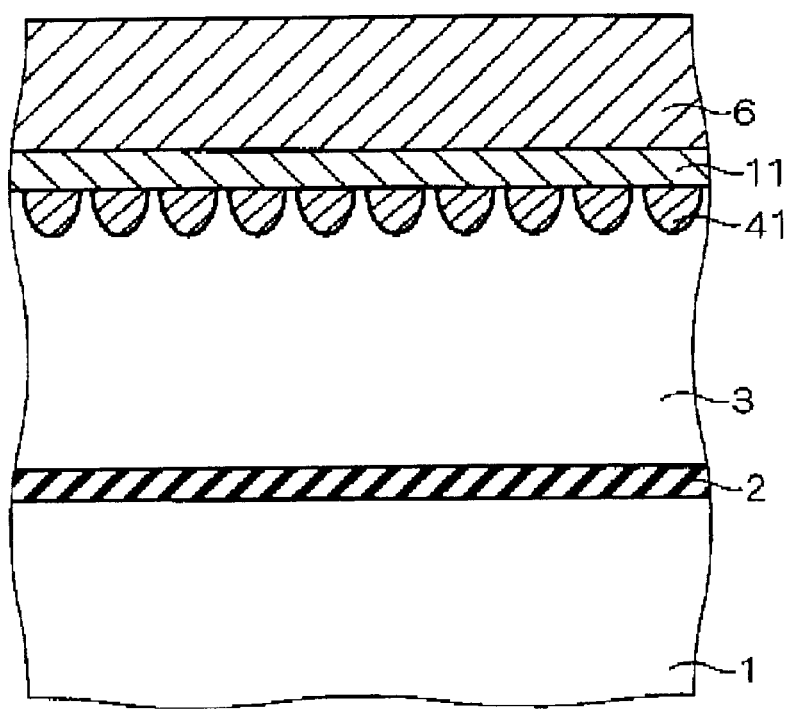

Referring to FIG. 19, a metal nitride film 11 such as a WN film is formed in a thickness of approximately 5 nm, for example, on the island suicide film 41 by means such as sputtering method. Referring to FIG. 20, a metal film 6 such as a W film is formed in a thickness of approximately 40 nm, for example, on the metal nitride film 11 by means such as sputtering method.

Figure 21:
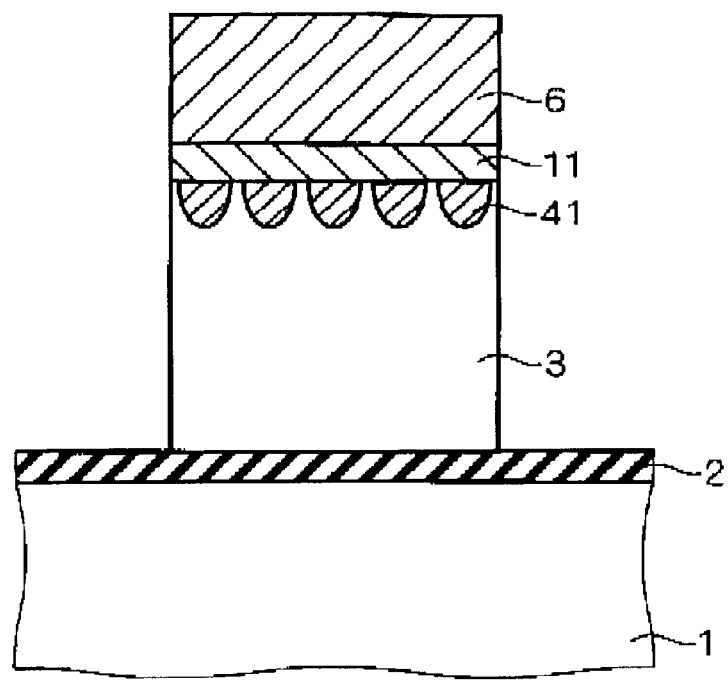

Referring to FIG. 21, the conductive silicon film 3, island silicide film 41, metal nitride film 11 and metal film 6 are patterned in the shape of a polymetal gate electrode by using photolithography and etching techniques.

Figure 22:
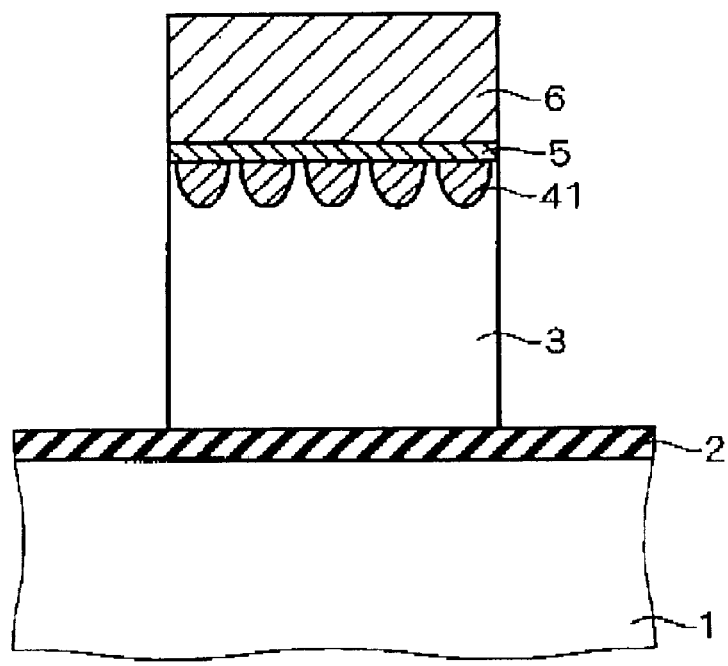

Subsequently, a heat treatment at about 950° C., for example, is performed such that the metal nitride film 11 is allowed to react with the silicon atoms in the directly underlying island silicide film 41 and conductive silicon film 3. The result is, as shown in FIG. 22, that a barrier film 5 containing metal atoms, nitrogen atoms and silicon atoms is formed in a thickness of approximately 1.5 nm, in the vicinity of the interface of the metal nitride film 11 and island silicide film 41 and the interface of the metal nitride film 11 and conductive silicon film 3. The barrier film 5 is, for example, a WSiN film.

As set forth in the second preferred embodiment, a WN film has a low stability to heat and, upon heat treatment, N component is separated and the WN film is easily transformed into a W film. Therefore, when the WN film is used for the metal nitride film 11, the area of the metal nitride film 11 except for the portion transformed into the barrier film 5 due to the heat treatment, becomes a W film which is then assimilated into the overlying metal film 6.

For instance, the above heat treatment may be one which is employed in the step of forming source/drain regions of a MISFET.

As a heat treatment for changing the silicide film 4 into the island silicide film 41, there may be utilized, for example, the heat treatment in performing CVD method when an insulating film such as a SiN film (e.g., corresponding to the insulating film 7 in FIG. 17) is formed on the metal film 6 in order to form a SAC structure.

With the method of the ninth preferred embodiment, it is able to manufacture the semiconductor device of the eighth preferred embodiment. In addition, since the barrier film 5 is formed by using the thermal reaction of the metal nitride film 11 with the island suicide film 41 and conductive silicon film 3, the resulting barrier film 5 is extremely thin, thereby effectively suppressing an increase in the resistance value between metal and conductive silicon.

Tenth Preferred Embodiment

A tenth preferred embodiment is a modification of the method of manufacturing a semiconductor device of the ninth preferred embodiment. In this method, before patterning a polymetal gate electrode, a barrier film 5 is formed in the vicinity of the interface of a metal nitride film 11 and an island silicide film 41 and a conductive silicon film 3.

The structure shown in FIG. 20 is formed with the same method as the ninth preferred embodiment.

Figure 23:
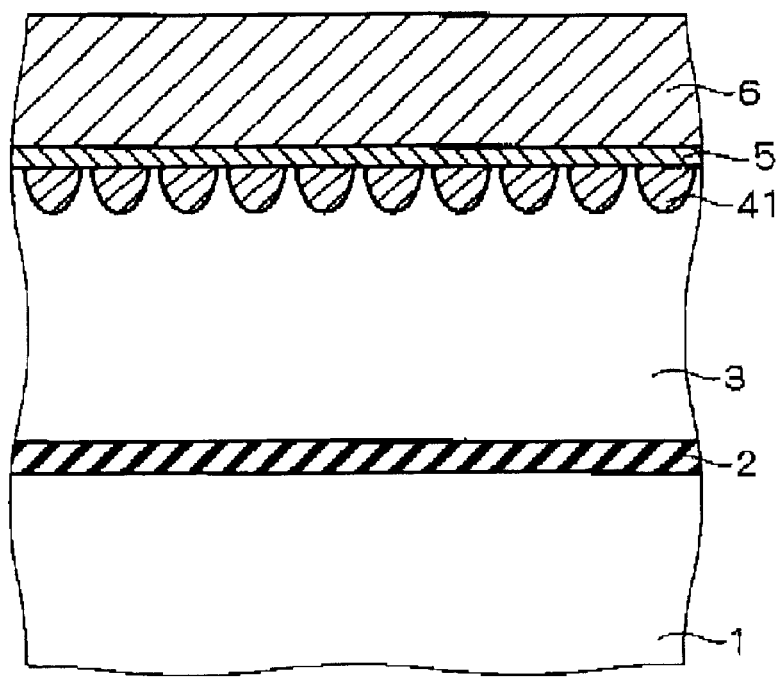
FIGS. 23 and 24 are diagrams illustrating the steps in a method of manufacturing a semiconductor device according to a tenth preferred embodiment.

Subsequently, a heat treatment at about 950° C., for example, is performed such that the metal nitride film 11 is allowed to react with the silicon atoms in the directly underlying island silicide film 41 and conductive silicon film 3. The result is, as shown in FIG. 23, that a barrier film 5 containing metal atoms, nitrogen atoms and silicon atoms is formed in a thickness of approximately 1.5 nm, in the vicinity of the interface of the metal nitride film 11 and island silicide film 41 and conductive silicon film 3. The barrier film 5 is, for example, a WSiN film. When a WN film is used for the metal nitride film 11, the area of the metal nitride film 11 except for the portion transformed into the barrier film 5 due to the beat treatment, becomes a W film which is then assimilated into the overlying metal film 6.

Figure 24:
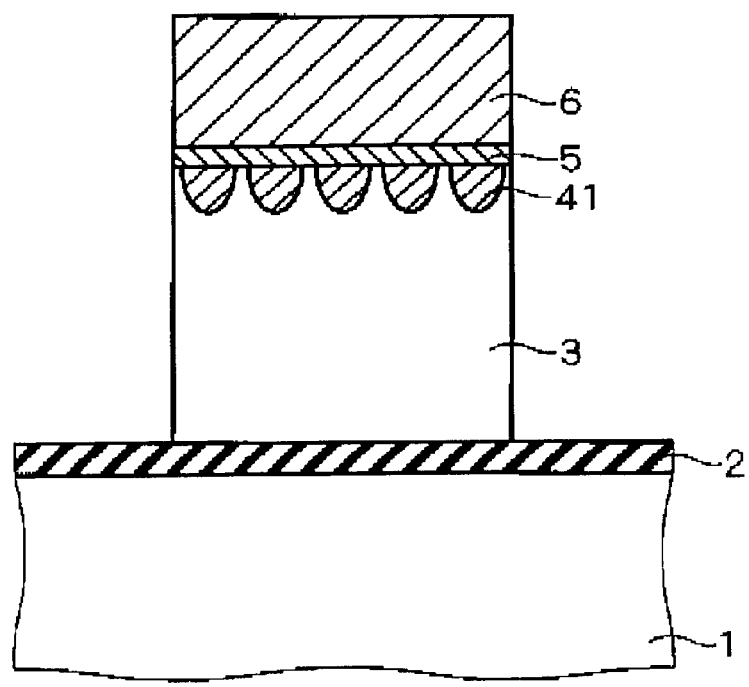

Referring to FIG. 24, the conductive silicon film 3, island silicide film 41, barrier film 5 and metal film 6 are patterned in the shape of a polymetal gate electrode by using photolithography and etching techniques.

With the method of the tenth preferred embodiment, there are the same effects as the method of the ninth preferred embodiment.

Eleventh Preferred Embodiment

An eleventh preferred embodiment is a modification of the semiconductor device of the eighth preferred embodiment, in which a film containing silicon atoms and at least either of nitrogen atoms and oxygen atoms is used as a barrier film 5.

Specifically in this embodiment, for example, one or a plurality of a SiN film, a SiO$_2$ film and a SiON film are used as a barrier film 5. Otherwise, the structure is the same as the semiconductor device of the eighth preferred embodiment. For instance, a poly-Si film, a W film and a WSi film may be adopted for the conductive silicon film 3, metal film 6 and island silicide film 41, respectively.

Under this structure, the result of measurement of the resistance-current density characteristic between metal and conductive silicon was similar to that in FIG. 2. Therefore, even by using the semiconductor device of this embodiment, it is able to realize a semiconductor device comprising a polymetal gale electrode exhibiting low resistance property and ohmic property.

The metal atoms contained in the island silicide film 41 may be of one or a plurality of types selected from the group consisting of W, Mo, Ti, Ta, Nb, V, Zr, Hf, Cr and Co. In any case, the same effect as set forth is obtainable.

Twelfth Preferred Embodiment

A twelfth preferred embodiment relates to a method of manufacturing the semiconductor device of the eleventh preferred embodiment. Description will be made by referring to FIGS. 3 to 5, FIG. 18, and FIGS. 24 to 26.

Like the method of manufacturing a semiconductor device of the second preferred embodiment, firstly, on a semiconductor substrate 1 such as a silicon substrate, a gate insulating film 2 such as an oxide film is formed in a thickness of approximately 3 nm, for example, by means such as thermal oxidation method (FIG. 3). Subsequently, a conductive silicon film 3 such as a poly-Si film is formed in a thickness of approximately 100 nm, for example, on the gate insulating film 2 by means such as CVD method (FIG. 4).

Then, a silicide film 4 such as a WSi film is formed in a thickness of approximately 5 nm, for example, on the conductive silicon film 3 by means such as sputtering method (FIG. 5).

The silicide film 4 is then allowed to condense in an island shape, thereby to form an island silicide film 41 (FIG. 18). The condensation of the silicide film 41 can be realized by performing a heat treatment at about 900° C., for example.

Figure 25:
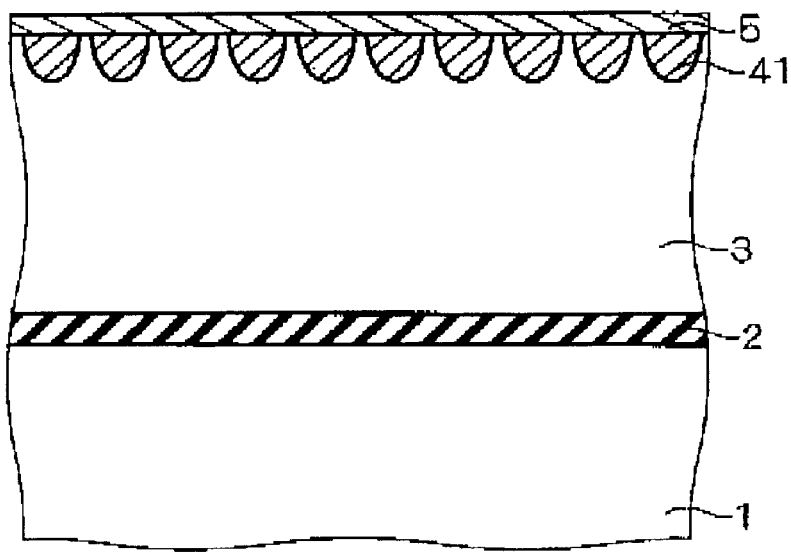
FIGS. 25 and 26 are diagrams illustrating the steps in a method of manufacturing a semiconductor device according to a twelfth preferred embodiment.
Figure 26:
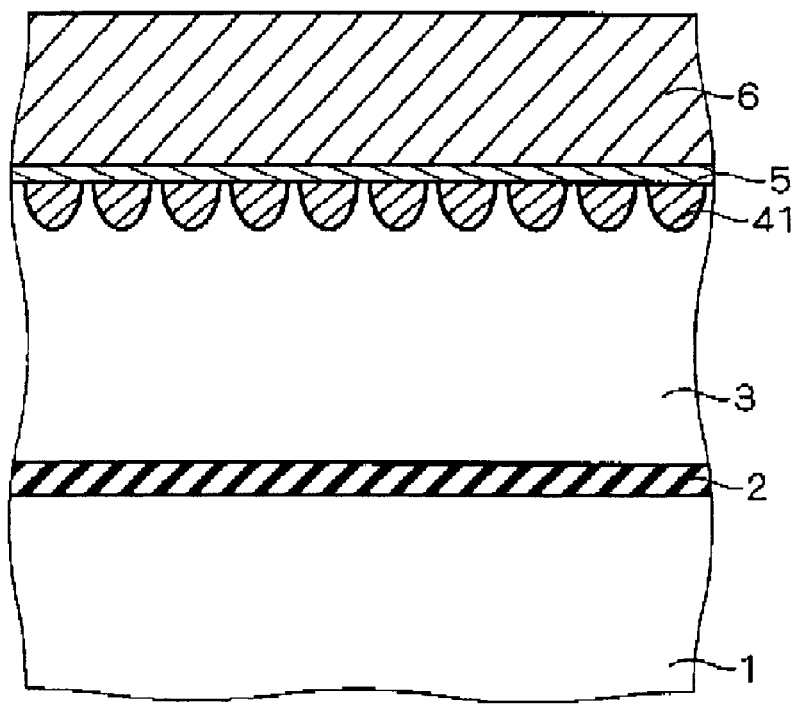

Referring to FIG. 25, a barrier film 5 such as a SiN film is formed in a thickness of approximately 3 nm, for example, on the island silicide film 41 by means such as CVD method. Referring to FIG. 26, a metal film 6 such as a W film is formed in a thickness of approximately 40 nm, for example, on the barrier film 5 by means such as sputtering method.

Like the case of FIG. 24, the conductive silicon film 3, island silicide film 41, barrier film 5 and metal film 6 are patterned in the shape of a polymetal gate electrode by using photolithography and etching techniques.

As a heat treatment for changing the silicide film 4 into the island silicide film 41, there may be utilized, for example, the heat treatment in performing CVD method when an insulating film such as a SiN film is formed on the metal film 6 in order to form a SAC structure.

With the method of the twelfth preferred embodiment, it is able to manufacture the semiconductor device of the eleventh preferred embodiment.

Thirteenth Preferred Embodiment

A thirteenth preferred embodiment is also a modification of the semiconductor device of the eighth preferred embodiment, in which a film containing nitrogen atoms and metal atoms is used as a barrier film 5.

Specifically in this embodiment, for example, a TiN film is used as a barrier film 5. Otherwise, the structure is the same as the semiconductor device of the eighth preferred embodiment. For instance, a poly-Si film, a W film and a WSi film may be adopted for the conductive silicon film 3, metal film 6 and island silicide film 41, respectively.

Under this structure, the result of measurement of the resistance-current density characteristic between metal and conductive silicon was similar to that in FIG. 2. Therefore, even by using the semiconductor device of this embodiment, it is able to realize a semiconductor device comprising a polymetal gate electrode exhibiting low resistance property and ohmic property.

The metal atoms contained in the island silicide film 41 and barrier film 5 may be of one or a plurality of types selected from the group consisting of W, Mo, Ti, Ta, Nb, V, Zr Hf, Cr and Co. In any case, the same effect as set forth is obtainable.

Fourteenth Preferred Embodiment

A fourteenth preferred embodiment relates to a method of manufacturing the semiconductor device of the thirteenth preferred embodiment. Description will be made by referring to FIGS. 3 to 5, FIG. 18, and FIGS. 24 to 26.

Like the method of manufacturing a semiconductor device of the second preferred embodiment, firstly, on a semiconductor substrate 1 such as a silicon substrate, a gate insulating film 2 such as an oxide film is formed in a thickness of approximately 3 nm, for example, by means such as thermal oxidation method (FIG. 3). Subsequently, a conductive silicon film 3 such as a poly-Si film is formed in a thickness of approximately 100 nm, for example, on the gate insulating film 2 by means such as CVD method (FIG. 4).

Then, a silicide film 4 such as a WSi film is formed in a thickness of approximately 5 nm, for example, on the conductive silicon film 3 by means such as sputtering method (FIG. 5).

The silicide film 4 is then allowed to condense in an island shape, thereby to form an island silicide film 41 (FIG. 18). The condensation of the silicide film can be realized by performing a heat treatment at about 900° C., for example.

Like the case of FIG. 25, a barrier film 5 such as a TiN film is formed in a thickness of approximately 10 nm, for example, on the island silicide film 41 by means such as sputtering method. Like the case of FIG. 26, a metal film 6 such as a W film is formed in a thickness of approximately 40 nm, for example, on the barrier film 5 by means such as sputtering method.

Like the case of FIG. 24, the conductive silicon film 3, island silicide film 41, barrier film 5 and metal film 6 are patterned in the shape of a polymetal gate electrode by using photolithography and etching techniques.

As a heat treatment for changing the silicide film 4 into the island silicide film 41, there may be utilized, for example, the heat treatment in performing CVD method when an insulating film such as a SiN film is formed on the metal film 6 in order to form a SAC structure.

With the method of the fourteenth preferred embodiment, it is able to manufacture the semiconductor device of the thirteenth preferred embodiment.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a substrate;
   at least one conductive silicon film overlying said substrate;
   a silicide film overlying each of said conductive silicon film and containing metal atoms and silicon atoms;
   a barrier film overlying said silicide film and having any one of a first combination containing metal atom, nitrogen atoms and silicon atoms, a second combination containing silicon atoms and at least one of oxygen atoms and nitrogen atoms, and a third combination containing metal atoms and nitrogen atoms; and
   a metal film overlying said barrier film,
   wherein each of said conductive silicon film contains a dopant, and
   said silicide film is formed in the shape of discontinuous islands overlying each of said conductive silicon film.

2. The semiconductor device according to claim 1 wherein
   said metal atoms contained in said silicide film is of one or a plurality of types selected from the group consisting of W, Mo, Ti, Ta, Nb, V, Zr, Hf, Cr and Co.

3. The semiconductor device according to claim 1 wherein
   said barrier film has said first or third combination, and
   said metal atoms contained in said barrier film is of one or a plurality of types selected from the group consisting of W, Mo, Ti, A, Nb, V, Zr, Hf, Cr and Co.

4. A CMOS transistor comprising at least two semiconductor devices according to claim 1, as first and second semiconductor devices, wherein
   structures including said conductive silicon film, said silicide film, said barrier film and said metal film of said first and second semiconductor devices are used as gate electrodes,
   gate insulating films are disposed between said substrate and said conductive silicon film of said first and second semiconductor devices, respectively,
   wells and source/drain regions are disposed in said substrate of said first and second semiconductor devices, respectively, and
   said conductive silicon films are electrically connected between said first and second semiconductor devices.

* * * * *